United States Patent
Yoon et al.

(10) Patent No.: US 7,016,256 B2
(45) Date of Patent: Mar. 21, 2006

(54) DATA INPUT UNIT OF SYNCHRONOUS SEMICONDUCTOR MEMORY DEVICE, AND DATA INPUT METHOD USING THE SAME

(75) Inventors: Young Jin Yoon, Ichon-Shi (KR); Seung Min Lee, Ichon-Shi (KR); Si Hong Kim, Yongin-Shi (KR)

(73) Assignee: Hynix Semiconductor Inc., Kyungki-Do (KR)

(*) Notice: Subject to any disclaimer, the term of this patent is extended or adjusted under 35 U.S.C. 154(b) by 311 days.

(21) Appl. No.: 10/734,804

(22) Filed: Dec. 12, 2003

(65) Prior Publication Data
US 2004/0213073 A1 Oct. 28, 2004

(30) Foreign Application Priority Data
Apr. 28, 2003 (KR) .................. 10-2003-0026676

(51) Int. Cl.
*G11C 8/00* (2006.01)

(52) U.S. Cl. .............. 365/233; 365/189.05; 365/230.08
(58) Field of Classification Search ................. 365/233, 365/230.06, 230.08, 189.05, 193
See application file for complete search history.

(56) References Cited

U.S. PATENT DOCUMENTS

| | | | |
|---|---|---|---|
| 5,822,268 A | 10/1998 | Kirihata | |
| 5,949,732 A | 9/1999 | Kirihata | |
| 5,978,281 A | 11/1999 | Anand et al. | |
| 6,038,634 A | 3/2000 | Ji et al. | |
| 6,078,546 A * | 6/2000 | Lee | 365/233 |
| 6,081,477 A | 6/2000 | Li | |
| 6,118,726 A | 9/2000 | Ji et al. | |
| 6,154,418 A | 11/2000 | Li | |
| 6,279,116 B1 * | 8/2001 | Lee | 713/601 |
| 6,563,759 B1 * | 5/2003 | Yahata et al. | 365/233 |
| 6,772,312 B1 * | 8/2004 | Mes | 711/169 |

FOREIGN PATENT DOCUMENTS

| | | |
|---|---|---|
| JP | 11328963 | 11/1999 |
| JP | 2000-132964 | 5/2000 |
| JP | 2000-222877 | 8/2000 |
| JP | 2000-339957 | 12/2000 |
| JP | 2001-205132 | 7/2001 |
| JP | 2001-244921 | 9/2001 |

* cited by examiner

Primary Examiner—Gene N. Auduong
(74) Attorney, Agent, or Firm—Marshall, Gerstein & Borun LLP

(57) ABSTRACT

Provided is a data input unit of a synchronous semiconductor memory device comprising: means for generating a rising edge signal and a falling edge signal at a rising edge and a falling edge of a data strobe signal DQS to be input; means for generating a second falling edge signal whenever two falling edge signals are generated in response to the data strobe signal; a data transforming means for dividing input data into four and latching the four divided data in response to the rising edge signal and falling edge signal, and then latching again the four divided data in response to the second falling edge signal; and a global input/output signal generator for transmitting the data from the data transforming means to a global input/output line in response to a strobe clock.

8 Claims, 5 Drawing Sheets

DATA INPUT UNIT OF SYNCHRONOUS SEMICONDUCTOR MEMORY DEVICE, AND DATA INPUT METHOD USING THE SAME

BACKGROUND

1. Field of the Invention

The present invention relates to a data input unit of a synchronous semiconductor memory device, and more specifically, to a data input unit and a data input method of a synchronous semiconductor memory device capable of operating at a high frequency.

2. Discussion of Related Art

In order to enhance an operation speed of a DRAM, there has been developed a synchronous DRAM (Synchronous Dynamic Random Access Memory: hereinafter, referred to as "SDRAM"), which operates in synchronism with an external system clock.

In order to further enhance the data processing speed, there has been developed a Rambus DRAM and a double data rate (DDR) SDRAM which perform data processing in synchronism with a rising edge and a falling edge of one system clock.

In a DDR SDRAM, a source synchronous interface is used to transfer data at a high speed. This means that the data input/output is synchronized with a data strobe signal, commonly referred to as "DQS", which is generated together with data from a data source.

A conventional data input unit of a synchronous semiconductor memory device is shown in FIG. 1.

The conventional data input unit comprises a DQS buffer 10 for buffering a data strobe signal DQS, a DIN buffer 20 for buffering input data DIN, a first latch 30 for latching the input data DIN in response to a rising edge dsr4 of the DQS, a second latch 40 for latching the input data DIN in response to a falling edge dsf4 of the DQS, a third latch 50 for latching the input data DIN latched in the first latch 30 in response to the falling edge dsf4 of the DQS, and a global input/output signal generator 60 for generating a global input/output signal in response to a strobe clock and the input data DIN latched in the second latch 40 and the third latch 50.

In a writing operation, a first input data is latched in the first latch 30 in response to the rising edge dsr4 of the DQS. A second input data is stored in the second latch 40 in response to the falling edge dsf4 of the DQS and, at the same time, the first input data latched in the first latch 30 is stored in the third latch 50 in response to the falling edge dsf4 of DQS.

The first and second input data latched in the third and second latches 50 and 40, respectively, are sent to the global input/output signal generator 60 in response to the strobe clock, and the global input/output signal generator 60 generates a global input/output signal GIO.

Therefore, the input data are aligned by two in response to the falling edge dsf4 of the DQS.

On the other hand, according to the JEDEC Standard, the value of a write command to first DQS latching transition (tDQSS) lies in the range of from 0.75*tCK to 1.25*tCK. Accordingly, the falling edge dsf4 of the DQS also lies in the range from 0.75*tCK to 1.25*tCK, and thus a margin of the falling edge dsf4 of the DQS is 0.5*tCK. This will be explained with reference to FIG. 2 as follows.

In FIG. 2, a data latched when the tDQSS is 0.75*tCK, a data latched when the tDQSS is 1.25*tCK, and a strobe clock are shown.

As shown in FIG. 2, an interval where valid data always exists is 1.0*tCK (a period in which the falling edge dsf4 signals of the DQS are input) −0.5*tCK (a difference between times at which the falling edge dsf4 signals of the DQS may be latched since the falling edge dsf4 signals of the DQS may be input with a time difference of 0.5*tCK)= 0.5*tCK. Therefore, the maximum margin of the data which is synchronized with the strobe clock occurs when the strobe clock lies at the exact middle point of the interval where the valid data always exists, and in this case, the maximum margin is 0.25*tCK.

The ordinary operation is performed as described above. The DQS should return to a high impedance state Hi-Z after a Write DQS Postamble Time tWPST of 0.4~0.6*tCK when the data input in the write operation is finished. However, if an additional undesirable pulse is generated due to a generation of ringing in the DQS, an erroneous write operation may occur.

When the tDQSS is 0.75*tCK, a DQS ringing generated after the tWPST of 0.4~0.6*tCK, that is, after the second DQS, is shown in FIG. 3. The first and second input data are aligned normally in response to the normal falling edge dsf4 signal. However, when the additional rising and falling edges dsr4 and dsf4 are generated internally by a DQS glitch signal newly generated due to the DQS ringing, the third and fourth input data are changed into unknown new data in response to the additional falling edge dsf4. As a result, the unknown data are aligned in response to the additional falling edge signal dsf4 before the strobe clock signal is generated. Accordingly, erroneous global input/output signals GIO may be generated.

To prevent this error, the strobe clock signal should be applied before the additional falling edge signal dsf4 is generated, so that correct data is sent to the global input/output signal generator 60.

The interval between the strobe clock signal and the last DQS signal generated (the DQS signal when the value of tDQSS is 0.75*tCK) is 0.75*tCK. Therefore, an error will not occur if the frequency satisfies a condition of 0.75*tCK≦0.4*tCK (minimum value of tWPST, which has a range of 0.4*tCK to 0.6*tCK)+rPW (pluse width of the ringing signal, the pulse width being a time until the falling of the ringing signal occurs because the falling edge signal dsf4 is generated by the falling edge signal of the DQS). If the value of the rPW is 400 ps, the period of the clock pulse tCK should be larger than 14 ns to prevent the error.

Therefore, in the conventional circuit, the write operation may not be performed at a high frequency because the margin between the strobe clock signal and the data latched in response to the falling edge signal dsf4 is too small, and in this case, an error of the write operation may occur when the ringing signal is generated in the DQS signal.

SUMMARY OF THE INVENTION

Therefore, the present invention is directed to a data input unit and a data input method for a synchronous semiconductor memory device for generating the falling edge signal dsf4 synchronized with the strobe signal not every clock, but every two clocks.

The present invention is also directed to a data input unit and a data input method for a synchronous semiconductor memory device, capable of performing a normal write operation at a high frequency by activating a block for aligning a DQS only until tWPST+rPW passes after a write command is input.

According to one aspect of the present invention, there is provided a data input unit of a synchronous semiconductor memory device comprising: means for generating a rising edge signal and a falling edge signal at a rising edge and a falling edge of a data strobe signal DQS to be input; means for generating a second falling edge signal whenever two falling edge signals are generated in response to the data strobe signal; a data transforming means for dividing input data into four and latching the four divided data in response to the rising edge signal and the falling edge signal, and then latching again the four divided data in response to the second falling edge signal; and a global input/output signal generator for transmitting the data from the data transforming means to a global input/output line in response to a strobe clock.

The data transforming means comprises: a first latch for latching input data in response to the rising edge signal; a first latch group comprising a second latch and a third latch for latching input data latched by the first latch and new input data respectively in response to the falling edge signal; a second latch group comprising a fourth latch, a fifth latch and a sixth latch for latching respective input data latched by the second latch and third latch, and new input data respectively in response to the rising edge signal; a third latch group comprising a seventh latch, an eighth latch, a ninth latch and a tenth latch for latching respective input data latched by the fourth latch, the fifth latch and the sixth latch, and new input data respectively in response to the falling edge signal; a fourth latch group comprising an eleventh latch, a twelfth latch, a thirteenth latch and a fourteenth latch for latching respective input data latched by the seventh latch, the eighth latch, the ninth latch and the tenth latch respectively in response to the second falling edge signal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Now, the preferred embodiment of the present invention will be described in detail with reference to the accompanying drawings.

Figure 1:
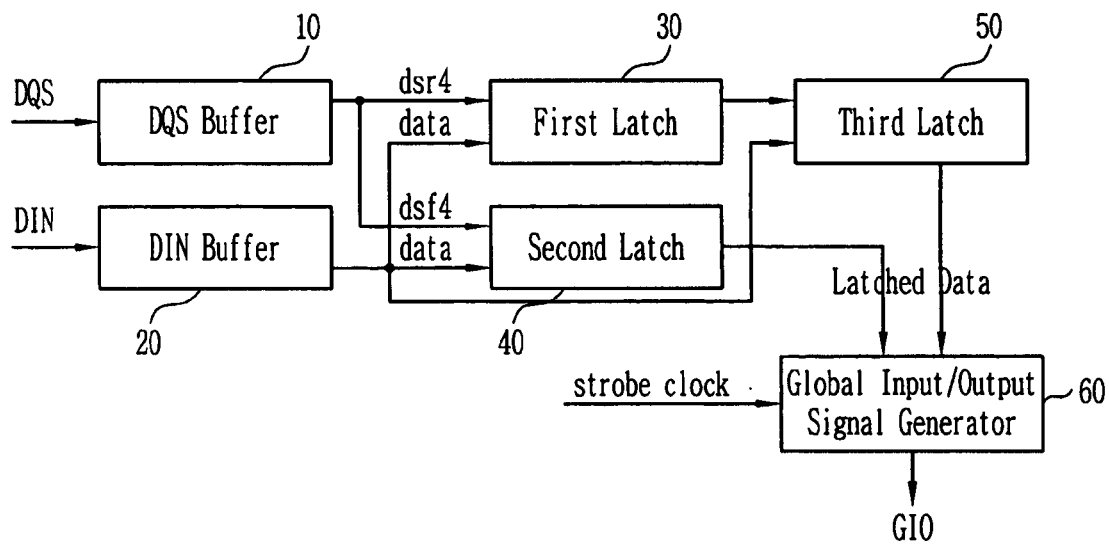
FIG. 1 is a block diagram illustrating a conventional data input unit of a synchronous semiconductor memory device.
Figure 2:
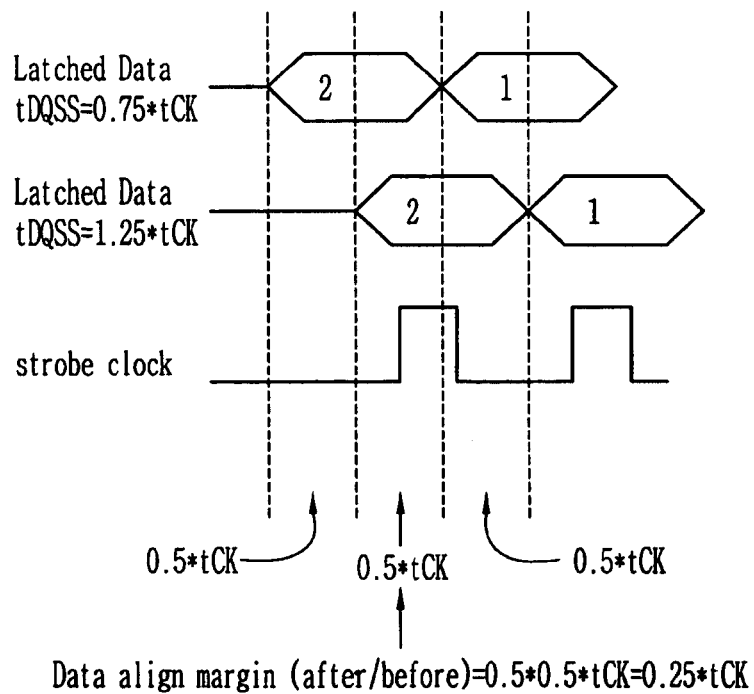
FIG. 2 is a timing chart illustrating a data margin.
Figure 3:
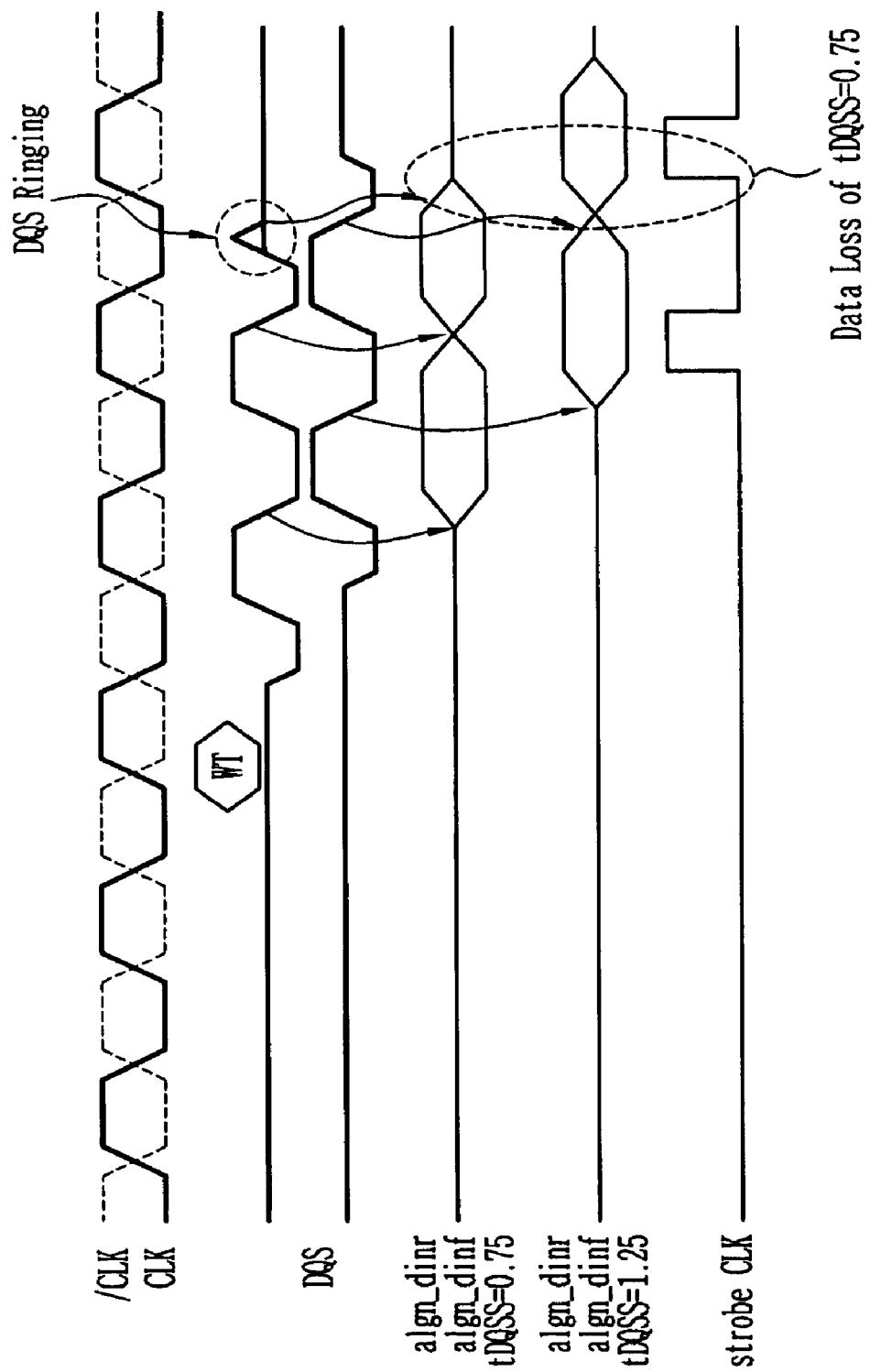
FIG. 3 is a timing chart illustrating a problem of the conventional data input unit of a synchronous semiconductor memory device.
Figure 4:
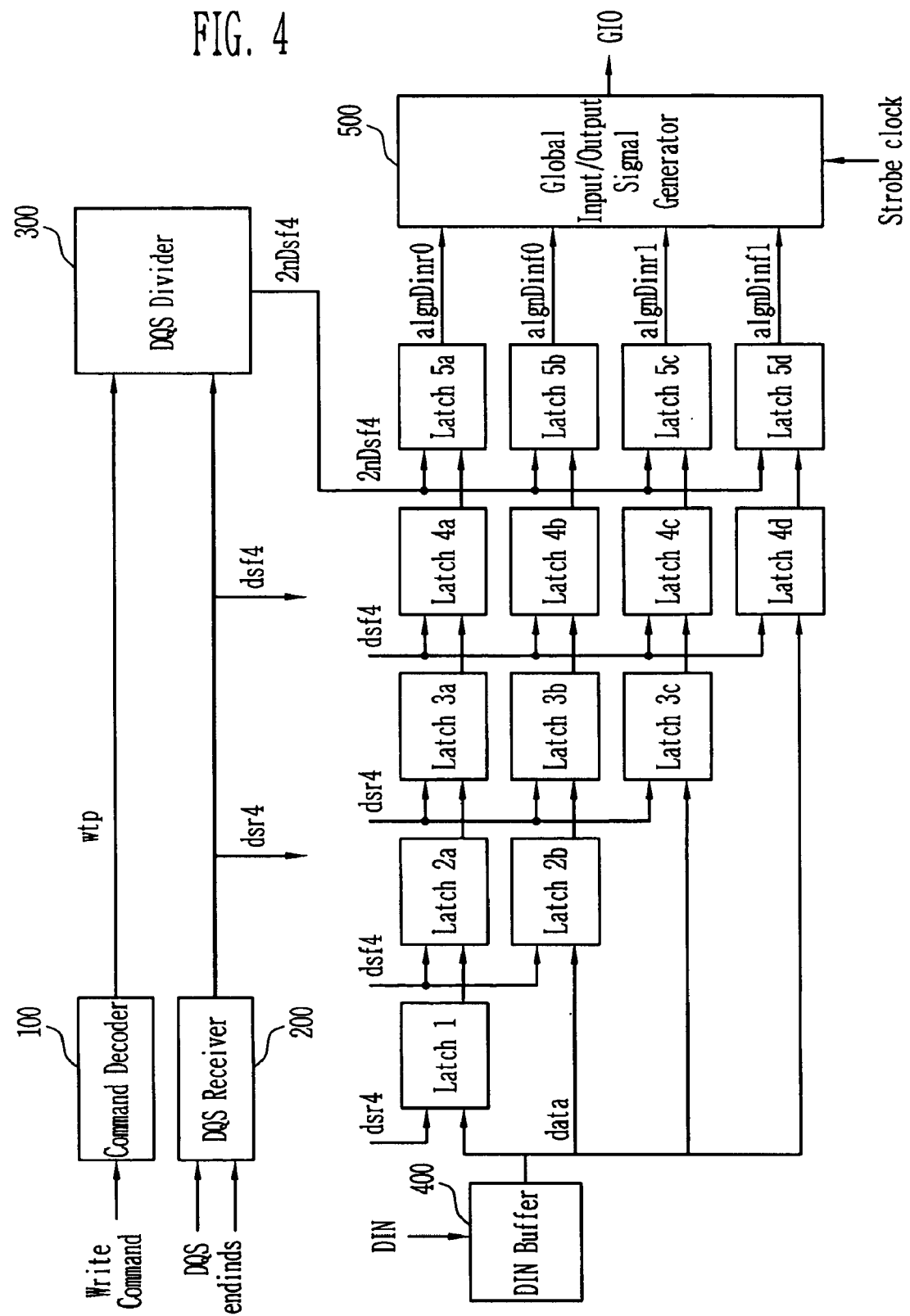
FIG. 4 is a block diagram illustrating a data input unit of a synchronous semiconductor memory device in accordance with the present invention.
Figure 5:
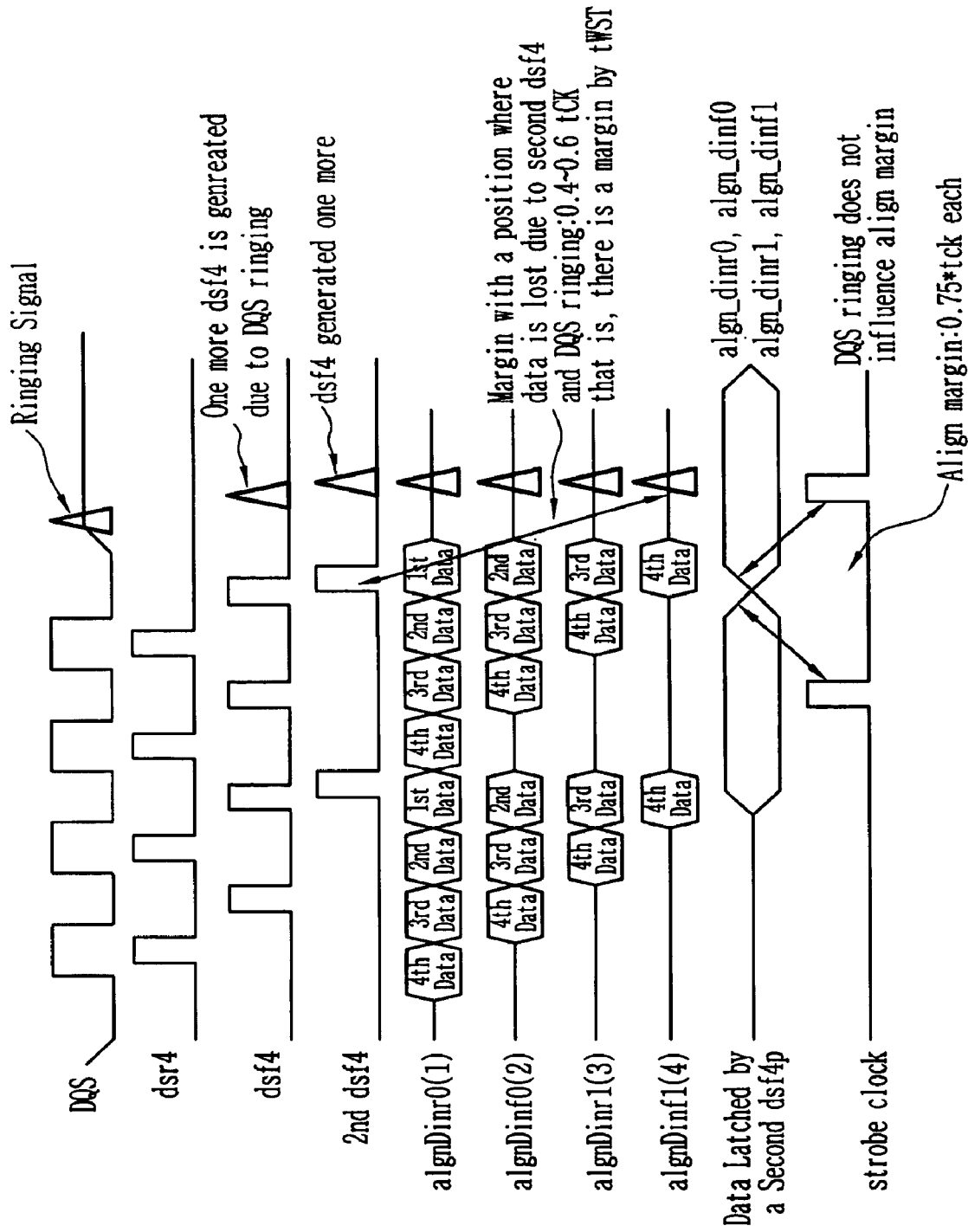
FIGS. 5 and 6 are timing charts illustrating the operation of the data input unit shown in FIG. 4.

FIG. 4 is a block diagram illustrating a data input unit of a synchronous semiconductor memory device in accordance with the present invention, and its operation will be explained with reference to FIG. 5.

Supposing that a write operation is performed at a time with burst length BL equal to 4, a first data from a DIN buffer 400 is latched in Latch1 in response to a rising edge signal dsr4 from a DQS receiver 200.

When a falling edge signal dsr4 is generated from the DQS receiver 200, the first data (1st data) latched in the Latch1 is sent to Latch 2a, and a second data (2nd data) is latched in Latch2b simultaneously. Further, when the rising edge signal dsr4 is again applied, the first data latched in the Latch2a and the second data latched in the Latch2b are sent to Latch3a and Latch3b, respectively, and a third data (3rd data) is latched in Latch1 and Latch3c.

Subsequently, when the falling edge signal dsf4 is generated, the first data, the second data and the third data (1st data, 2nd data, and 3rd data) latched, respectively, in the Latch3a, the Latch3b and the Latch3c are sent to Latch 4a, Latch4b and Latch4c, respectively, the first data (1st data) latched in Latch1 is sent to the Latch2, and a fourth data (4th data) is latched in Latch4d.

Subsequently, when a second falling edge signal 2nDsf4 is generated from the DQS divider 300, the data latched, respectively, in the Latch4a, the Latch4b, the Latch4c and the Latch4d are sent to Latch5a, Latch5b, Latch5c and Latch5d, and the data latched, respectively, in the Latch5a, the Latch5b, the Latch5c and the Latch5d are sent to a global input/output signal generator 500 in response to a strobe signal. That is, the data Din are aligned to the Latches with waveforms of algnDinr0(1), algnDinr0(2), algnDinr1(3) and algnDin1(4) shown in FIG. 5.

The second falling edge signal 2nDsf4 can be generated by a write command. That is, a write pulse signal wtp indicating a write command is generated by a command decoder 100 in response to a write command inputted from outside. The second falling edge signal 2nDsf4 is generated immediately after two DQS pulses are generated, that is, two falling edge signals dsf4 are applied after activation of the write pulse signal wtp. Supposing that a DQS ringing is input as shown in FIG. 5, the second falling edge signal 2nDsf4 is generated within a time of 0.75*tCK+1.5*tCK+ 0.4*tCK+rPW=2.65*tCK+400 ps, where 0.75*tCK is a minimum value of tDQSS, 1.5*tCK is a width of two ordinary DQS pulses (dsr4-dsf4-dsr4-dsf4), 0.4*tCK is a value of tWPST, and 400 ps is supposed as a value of rPW which is a pulse width of the ringing signal. Therefore, when respective data latched in the Latch4a, the Latch 4b, the Latch4c and the Latch4d are sent to the Latch 5a, the Latch 5b, the Latch5c and the Latch5d, respectively, in response to the second falling edge signal 2nDsf4, the data which is synchronized with the strobe clock becomes ordinary data having a period of two clocks, even though an additional falling edge signal dsf4 is generated due to the DQS ringing.

A further implication of an errorless write operation conditioned on a second falling edge signal 2nDsf4 occurring within 2.65*tCK+400 ps is that a signal controlling the DQS divider 300 is generated and sent within 2.65*tCK+ 400 ps. If the interval between the external input of the write command and the sending of the write pulse signal wtp to the DQS divider 300 is 4 ns, then an operable frequency is 1.36 ns, that is, tCk=735 Mhz.

Figure 6:
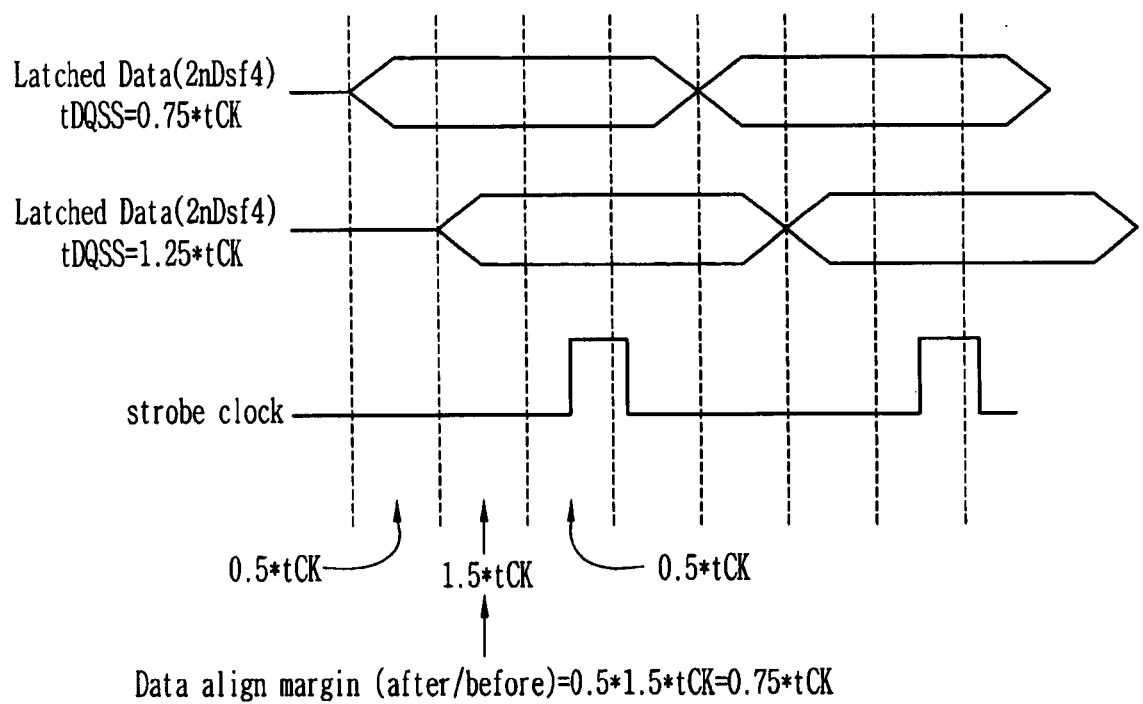

Since the second falling edge signal 2nDsf4 is provided every two clocks, the data latched in the Latch5a, the Latch5b, the Latch5c and the Latch5d have a data align margin of only the difference due to the values of tDQSS, as shown in FIG. 6. Because an interval where valid data always exists is 1.5*tCK, the maximum data align margin is 0.75*tCK when the strobe clock is provided in the exact middle point of the interval where the latched data exists.

The rising edge signal dsr4 and/or the falling edge signal dsf4 of the aforementioned DQS may be generated in the DQS receiver 200, or may be generated together with the second falling edge signal 2nDsf4 in the DQS divider 300. The DQS divider 300 may be constituted in various ways using transistors and/or logic elements.

According to the present invention, it is possible to apply 4-bits free fetch method used in a DDR II SDRAM to the DDR SDRAM. Further, since the data which is synchronized with the strobe clock is changed every two clocks, it is possible to enlarge the data align margin due to tDQSS by 0.25*tCK to 0.75*tCK times, that is, by three times as large, as that of the conventional method, and to completely prevent the erroneous write operation due to the DQS ringing.

Although the foregoing description has been made with reference to the preferred embodiments, it is to be understood that changes and modifications of the present invention may be made by a person of ordinary skill in the art without departing from the spirit and scope of the present invention and appended claims.

What is claimed is:

1. A data input unit of a synchronous semiconductor memory device comprising:
   means for generating a rising edge signal and a falling edge signal at a rising edge and a falling edge of a data strobe signal DQS to be input;
   means for generating a second falling edge signal whenever two prior falling edge signals are generated in response to the data strobe signal;
   a data transforming means for dividing input data into four and latching the four divided data in response to the rising edge signal and the falling edge signal, and then latching again the four divided data in response to the second falling edge signal; and
   a global input/output signal generator for transmitting the data from the data transforming means to a global input/output line in response to a strobe clock.

2. The data input unit of a synchronous semiconductor memory device according to claim 1, wherein the data transforming means comprises:
   a first latch for latching input data in response to the rising edge signal;
   a first latch group comprising a second latch and a third latch for latching input data latched by the first latch and new input data, respectively, in response to the falling edge signal;
   a second latch group comprising a fourth latch, a fifth latch and a sixth latch for latching the respective input data latched by the second latch and the third latch, and new input data, respectively, in response to the rising edge signal;
   a third latch group comprising a seventh latch, an eighth latch, a ninth latch and a tenth latch for latching the respective input data latched by the fourth latch, the fifth latch and the sixth latch, and new input data, respectively, in response to the falling edge signal; and
   a fourth latch group comprising an eleventh latch, a twelfth latch, a thirteenth latch and a fourteenth latch for latching the respective input data latched by the seventh latch, the eighth latch, the ninth latch and the tenth latch, respectively, in response to the second falling edge signal.

3. The data input unit of a synchronous semiconductor memory device according to claim 1, wherein the strobe clock signal is applied to the global input/output signal generator during a period when data is latched in response to the second falling edge.

4. A data input method of a synchronous semiconductor memory device comprising the steps of:
   latching input data in a first latch in response to a rising edge signal of a data strobe signal;
   latching the input data latched in the first latch and new input data in a second latch and a third latch, respectively, in response to a falling edge signal of the data strobe signal;
   latching the respective input data latched in the second latch and the third latch and new input data in a fourth latch, a fifth latch and a sixth latch, respectively, in response to the rising edge signal;
   latching the respective input data latched in the fourth latch, the fifth latch and the sixth latch and new input data in a seventh latch, an eighth latch, a ninth latch and a tenth latch, respectively, in response to the falling edge signal;
   latching the respective input data latched in the seventh latch, the eighth latch, the ninth latch and the tenth latch in an eleventh latch, a twelfth latch, a thirteenth latch and a fourteenth latch, respectively, in response to a second falling edge signal which is generated whenever two falling edge signals are generated in response to the data strobe signal; and
   transmitting the respective input data latched in the eleventh latch, the twelfth latch, the thirteenth latch and the fourteenth latch to a global input/output line in response to a strobe clock.

5. The data input method of a synchronous semiconductor memory device according to claim 4, wherein the strobe clock signal is generated during a period when the data is latched in response to the second falling edge signal.

6. A data input unit of a synchronous semiconductor memory device comprising:
   a first signal generator producing a rising edge signal and a falling edge signal at a rising edge and a falling edge of a data strobe signal DQS to be input;
   a second signal generator producing a second falling edge signal whenever two falling edge signals are generated by the first signal generator;
   a latch network that divides input data into four, wherein the four divided data are latched in response to the rising edge signal and the falling edge signal, and wherein the four divided data are latched again in response to the second falling edge signal; and
   a global input/output signal generator for transmitting the data from the data transforming means to a global input/output line in response to a strobe clock.

7. The data input unit of a synchronous semiconductor memory device according to claim 6, wherein the latch network comprises:
   a first latch for latching input data in response to the rising edge signal;
   a first latch group comprising a second latch and a third latch for latching input data latched by the first latch and new input data, respectively, in response to the falling edge signal;
   a second latch group comprising a fourth latch, a fifth latch and a sixth latch for latching the respective input data latched by the second latch and the third latch, and new input data, respectively, in response to the rising edge signal;
   a third latch group comprising a seventh latch, an eighth latch, a ninth latch and a tenth latch for latching the respective input data latched by the fourth latch, the fifth latch and the sixth latch, and new input data, respectively, in response to the falling edge signal; and
   a fourth latch group comprising an eleventh latch, a twelfth latch, a thirteenth latch and a fourteenth latch for latching the respective input data latched by the seventh latch, the eighth latch, the ninth latch and the tenth latch, respectively, in response to the second falling edge signal.

8. The data input unit of a synchronous semiconductor memory device according to claim 6, wherein the strobe clock signal is applied to the global input/output signal generator during a period when data is latched in response to the second falling edge.

* * * * *